(12) United States Patent
Shirakawa et al.

(10) Patent No.: US 6,924,540 B2
(45) Date of Patent: Aug. 2, 2005

(54) INTEGRATED CIRCUIT DEVICE INSTALLED STRUCTURE AND INSTALLATION METHOD

(75) Inventors: Yasufumi Shirakawa, Osaka (JP); Masaki Taniguchi, Kyoto (JP); Hideo Fukuda, Kyoto (JP); Yuzo Shimizu, Osaka (JP); Shinya Esaki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/388,617

(22) Filed: Mar. 17, 2003

(65) Prior Publication Data

US 2004/0089859 A1 May 13, 2004

(30) Foreign Application Priority Data

Mar. 19, 2002 (JP) ........................................ 2002-076082

(51) Int. Cl.⁷ .......................................... H01L 31/0203
(52) U.S. Cl. ........................................ 257/434; 257/680
(58) Field of Search ................................ 257/431–434, 257/680, E31.117, E23.123, E23.128

(56) References Cited

U.S. PATENT DOCUMENTS 5,534,725 A * 7/1996 Hur .............................. 257/434
6,261,870 B1 * 7/2001 Haehn et al. ................ 438/124
6,379,988 B1 * 4/2002 Peterson et al. .............. 438/51

FOREIGN PATENT DOCUMENTS

JP        04-9381      2/1992
JP        2769255      4/1998

* cited by examiner

*Primary Examiner*—George Eckert
*Assistant Examiner*—Matthew E. Warren
(74) *Attorney, Agent, or Firm*—McDermott Will & Emery LLP (57) ABSTRACT

A packaging structure suitable for an integrated circuit device receiving short-wavelength laser light is provided. The integrated circuit device having a photo detecting part, leads and wires for connection therebetween are encapsulated in an encapsulation section. A recess is formed on the light incident surface of the encapsulation section above the photo detecting part, to thin the encapsulation section on the surface of the photo detecting part and thereby reduce the energy of light absorbed by the encapsulation section.

6 Claims, 11 Drawing Sheets

INTEGRATED CIRCUIT DEVICE INSTALLED STRUCTURE AND INSTALLATION METHOD

BACKGROUND OF THE INVENTION

The present invention relates to a technology relevant to a packaging structure of an integrated circuit device having a photo detecting part, such as an amplifier-embedded light receiving device for an optical disk unit.

Figure 11:
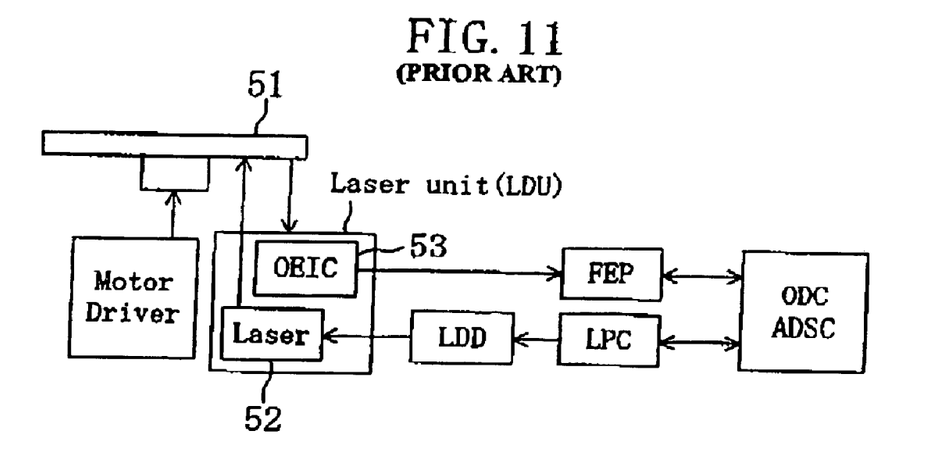
FIG. 11 is a block diagram of an optical disk unit having a laser unit.

FIG. 11 is a block diagram of an optical disk unit having a laser unit (LDU) shown in terms of functions. Referring to FIG. 11, the laser unit includes a laser device 52 and an integrated circuit device 53 having a photo detecting part (optoelectronic integrated circuit (OEIC)). Laser light is emitted from the laser device 52 toward an optical disk 51, and reflected light from the optical disk 51 is received by the photo detecting part of the integrated circuit device 53.

For improvement of the recording density of an optical disk, the beam diameter of laser light for irradiation of the optical disk has been narrowed. For attaining a narrower beam diameter, the wavelength of laser light has been gradually made shorter. For example, while the laser wavelength was 780 nm for CDs, it is 650 nm for DVDs. For next-generation DVDs now under development, a further short laser wavelength is used for higher density.

Problem to be Solved by the Invention

The inventors of the present invention and other researchers set out prototype fabrication and experiments using short-wavelength blue laser, and in this relation, the following problem was found. That is, a transparent resin was used for encapsulation of a device, as used for conventional OEICs for DVDs. In this case, however, the transparent resin was partly deformed/degraded when it was irradiated with short-wavelength blue laser light.

The above problem did not occur in the conventional OEICs for DVDs. The cause for this problem has not yet been clarified, but presumed pertinent to this problem as one factor is that with the shortened wavelength of the laser light, the energy of the laser light increases from the conventional level, causing generation of heat from the light absorbed by the resin.

SUMMARY OF THE INVENTION

An object of the present invention is providing a packaging structure suitable for an integrated circuit device receiving short-wavelength laser light, and a packaging method for the integrated circuit device.

Specifically, the packaging structure of an integrated circuit device having a photo detecting part of the present invention includes: a lead electrically connected with the integrated circuit device; and an encapsulation section for encapsulating the integrated circuit device and the lead, wherein the encapsulation section has a recess formed on a light incident surface above the photo detecting part.

Alternatively, the packaging structure of an integrated circuit device having a photo detecting part of the present invention includes: a lead electrically connected with the integrated circuit device; and an encapsulation section for encapsulating the integrated circuit device and the lead, wherein the encapsulation section has a hole formed above the photo detecting part.

The packaging method for an integrated circuit device having a photo detecting part of the present invention includes the steps of: (1) placing a pin having a through hole inside and a mold having a hole for insertion of the pin with respect to the integrated circuit device and a lead electrically connected with the integrated circuit device so that the pin is positioned above the photo detecting part through the hole of the mold; (2) pouring a material for encapsulation into the mold; and (3) blowing a gas for setting of the material to a surface of the photo detecting part via the through hole of the pin concurrently with the step (2) or before or after the step (2).

In the method of the present invention described above, in the step (3), a liquid for setting of the material may be poured in place of blowing the gas for setting of the material.

Alternatively, the packaging method for an integrated circuit device having a photo detecting part of the present invention includes the steps of: (1) placing a pin having a through hole inside and a mold having a hole for insertion of the pin with respect to the integrated circuit device and a lead electrically connected with the integrated circuit device so that the pin is positioned above the photo detecting part through the hole of the mold; (2) pouring a material for encapsulation into the mold; and (3) sucking the poured material from the surface of the photo detecting part via the through hole of the pin.

Alternatively, the packaging method for an integrated circuit device having a photo detecting part of the present invention includes the steps of: (1) placing a pin having a through hole inside and a mold having a hole for insertion of the pin with respect to the integrated circuit device and a lead electrically connected with the integrated circuit device so that the pin is positioned above the photo detecting part through the hole of the mold; (2) pouring a material for encapsulation into the mold; and (3) adsorbing a portion of the material poured in the step (2) having set on the surface of the photo detecting part to the pin under suction via the through hole, to remove the portion of the material.

Alternatively, the packaging method for an integrated circuit device having a photo detecting part of the present invention includes the step of encapsulating the integrated circuit device and a lead electrically connected with the integrated circuit device by applying an UV-curable resin to the integrated circuit device and the lead under irradiation with UV, wherein in the step of encapsulating, the UV-curable resin is applied avoiding application to the surface of the photo detecting part, to encapsulate a portion electrically connecting the integrated circuit device and the lead.

Alternatively, the packaging method for an integrated circuit device having a photo detecting part of the present invention includes the step of: encapsulating the integrated circuit device and a lead electrically connected with the integrated circuit device by applying an UV-curable resin to the integrated circuit device and the lead under irradiation with UV, wherein in the step of encapsulating, the UV-curable resin is applied to a surface of the integrated circuit device opposite to the surface on which the photo detecting part is formed, and the UV irradiation is performed from the side of the surface on which the photo detecting part is formed so as to encapsulate a portion electrically connecting the integrated circuit device and the lead while avoiding encapsulation of the surface of the photo detecting part.

Alternatively, the packaging method for an integrated circuit device having a photo detecting part of the present invention includes the steps of: encapsulating the integrated circuit device and a lead electrically connected with the integrated circuit device by forming an encapsulation section having a recess on a light incident surface above the photo detecting part and a projection projecting from the bottom of the recess; and removing a bottom portion of the encapsulation section underlying the recess by snapping the projection.

DESCRIPTION OF THE PREFERRED EMBODIMENTS

Hereinafter, preferred embodiments of the present invention will be described with reference to the accompanying drawings.

(Embodiment 1)

Figure 1:
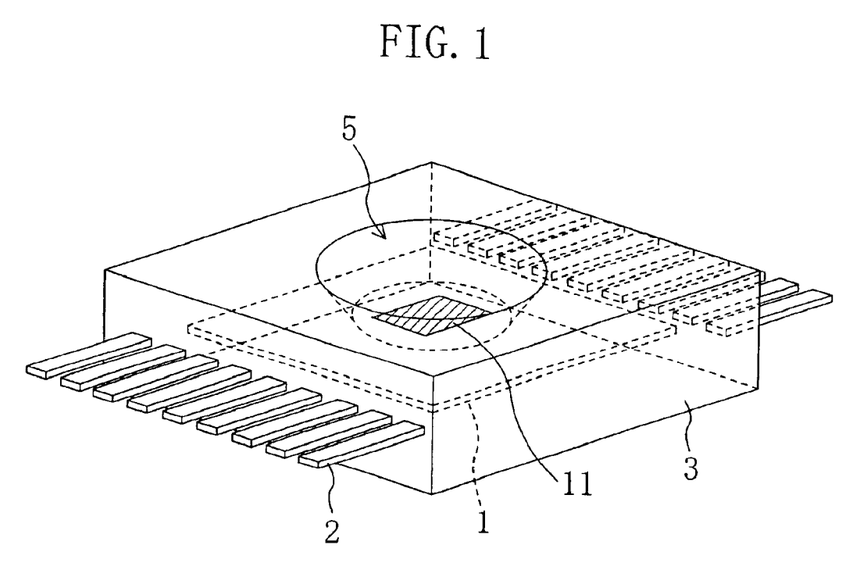
FIG. 1 is an external view of a packaging structure of Embodiment 1 of the present invention.

FIG. 1 is an external view of a packaging structure of an integrated circuit device of Embodiment 1 of the present invention. Referring to FIG. 1, the reference numeral 1 denotes an integrated circuit device having a photo detecting part 11, 2 denotes leads electrically connected with the integrated circuit device 1 via wires (not shown), and 3 denotes an encapsulation section formed of resin, for example, for encapsulating the integrated circuit device 1 and the leads 2. A recess 5 of a truncated cone shape is formed on the light incident surface of the encapsulation section 3 above the photo detecting part 11.

Figure 2:
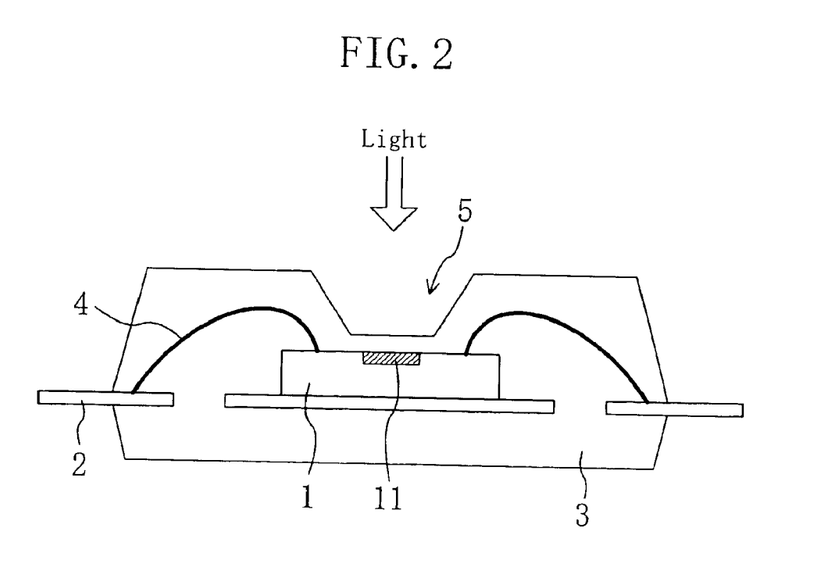
FIG. 2 is a cross-sectional view of the packaging structure of Embodiment 1 of the present invention.

FIG. 2 is a cross-sectional view of the packaging structure of this embodiment. As shown in FIG. 2, wires 4 are placed for connection between the integrated circuit device 1 and the leads 2, and are encapsulated in the encapsulation section 3 together with the integrated circuit device 1 and the leads 2. The recess 5 is formed deeper than the highest position of the wires 4, so that the level of the bottom of the recess 5 is lower than the highest position of the wires 4.

As shown in FIGS. 1 and 2, the portion of the encapsulation section 3 on the surface of the photo detecting part 11 can be thinned by forming the recess 5 on the light incident surface above the photo detecting part 11. The thinned portion of the encapsulation section 3 on the surface of the photo detecting part 11 increases in light transmittance, and decreases in absorbing energy of light. In other words, light is allowed to reach the photo detecting part 11 before being converted to heat in the encapsulation section 3. Therefore, this structure can avoid the conventional problem of melting of the resin. In addition, this structure protects the region including the wires 4, and also can protect the surface of the photo detecting part 11.

Since the energy of light absorbed by the portion of the encapsulation section 3 on the surface of the photo detecting part 11 decreases, the power of a laser device can be lowered by an amount corresponding to this decrease. This enables reduction of power consumption and also extension of the life of the laser device.

The truncated cone shape of the recess 5 makes it difficult for secondary light and scattered light to enter the photo detecting part 11. The shape of the recess 5 may not necessarily be a truncated cone, but may be a column, a prism, a truncated pyramid or the like. The inner wall of the recess 5 may be curved inwardly in the depth direction. In particular, the inner wall preferably constitutes a paraboloid. With such a shape, light reflected from the inner wall is prevented from entering the photo detecting part 11.

The recess 5 may have an outline allowing discernment of the position of a predetermined pin such as the first pin, for example, of the integrated circuit device 1 when viewed from top. By providing such an outline, marking can be omitted, and the orientation of the package, which is required during mounting/assembly, can be determined.

Figure 3A:
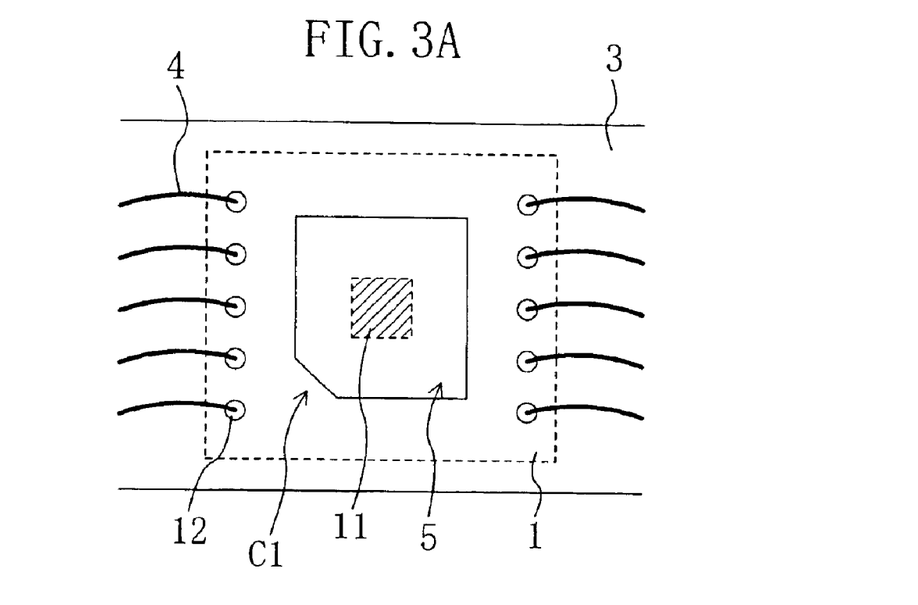
FIG. 3A is a plan view of the main portion of the packaging structure of Embodiment 1 of the present invention.
Figure 3B:
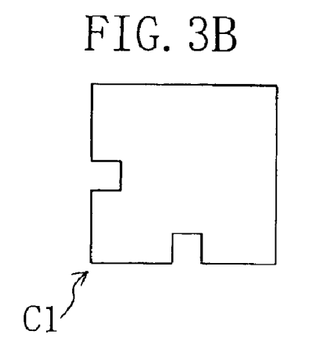
FIGS. 3B to 3E are alternative examples of the outline of the open top end of a recess.
Figure 3C:
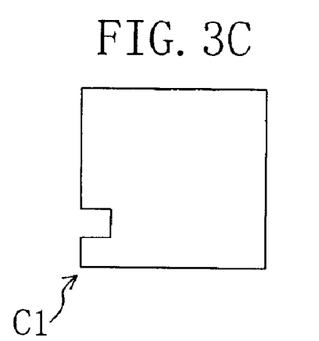
Figure 3D:
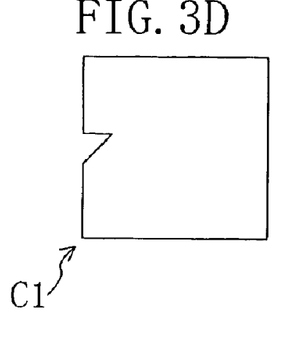
Figure 3E:
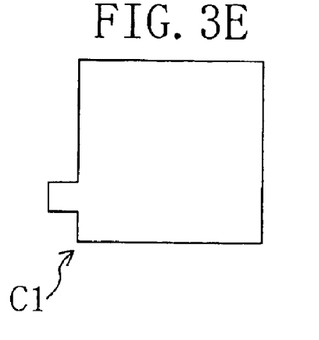

FIG. 3A is a plan view of the major portion of the packaging structure of this embodiment. In FIG. 3A, the open top end of the recess 5 has an outline of a rectangle with one corner C1 different in shape from the other corners. In the illustrated example, the corner C1 protrudes toward the center of the rectangle. From this corner C1 different in shape from the other corners, the position of a first pin 12 of the integrated circuit device 1 can be discerned, and thus the orientation of the package can be determined.

The open top end of the recess 5 may have any outline as long as the position of a predetermined pin of the integrated circuit device 1 can be discerned. FIGS. 3B to 3E show other examples of the outline of the open top end, in any of which the corner C1 can be specified. The open top end may not necessarily be used to specify the pin position, but other means such as the outline of the bottom, for example, may be used.

(Embodiment 2)

Figure 4:
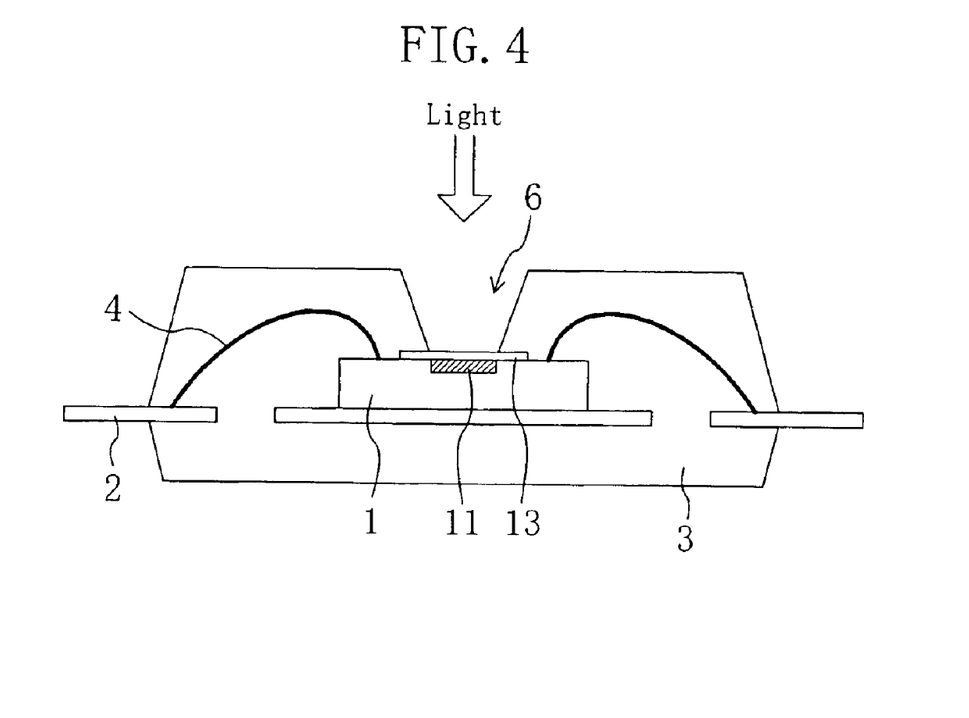
FIG. 4 is a cross-sectional view of a packaging structure of Embodiment 2 of the present invention.

FIG. 4 is a cross-sectional view of a packaging structure of an integrated circuit device of Embodiment 2 of the present invention. Referring to FIG. 4, a hole 6 of a truncated cone shape is formed through the encapsulation section 3 above the photo detecting part 11. A thin film 13 is formed on a region of the integrated circuit device 1 including the photo detecting part 11. The thin film 13 is formed of a nitride film and an oxide film.

As shown in FIG. 4, formation of the encapsulation section 3 on the surface of the photo detecting part 11 can be prohibited by forming the hole 6 above the photo detecting part 11. By this structure, the effect obtained in Embodiment 1 can be obtained. Also, in terms of protection of the chip, the integrated circuit device 1 is protected except for the region of the light emitting part 11, and the wires 4 for electrically connecting the integrated circuit device 1 and the leads 2 are also protected with the encapsulation section 3.

Moreover, with the thin film 13 formed on the photo detecting part 11, the photo detecting part 11 is protected with the thin film 13, and therefore the reliability is ensured. The thin film 13 is preferably formed of a protection film for protecting the photo detecting part 11 and an antireflection film. In this example, the nitride film corresponds to the protection film and the oxide film corresponds to the antireflection film. The nitride film may be omitted under certain circumstances, such as those where the light receiving surface has a sufficient strength.

As in Embodiment 1, the shape of the hole 6 may not necessarily be a truncated cone, but may be a column, a prism, a truncated pyramid or the like. The inner wall of the hole 6 may be curved inwardly in the depth direction.

Also, as in Embodiment 1, the hole 6 may be formed to have an outline allowing discernment of the position of a predetermined pin of the integrated circuit device 1 when viewed from top.

(Embodiment 3)

FIGS. 5A to 5D are cross-sectional views showing process steps of a packaging method for an integrated circuit device of Embodiment 3 of the present invention. In FIGS. 5A to 5D, the same components as those in FIG. 4 are denoted by the same reference numerals.

Figure 5A:
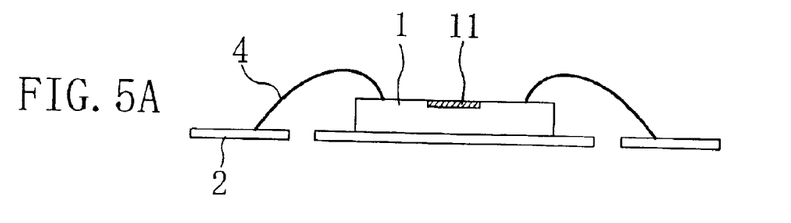
FIGS. 5A to 5D are cross-sectional views showing process steps of a packaging method for an integrated circuit device of Embodiment 3 of the present invention.
Figure 5B:
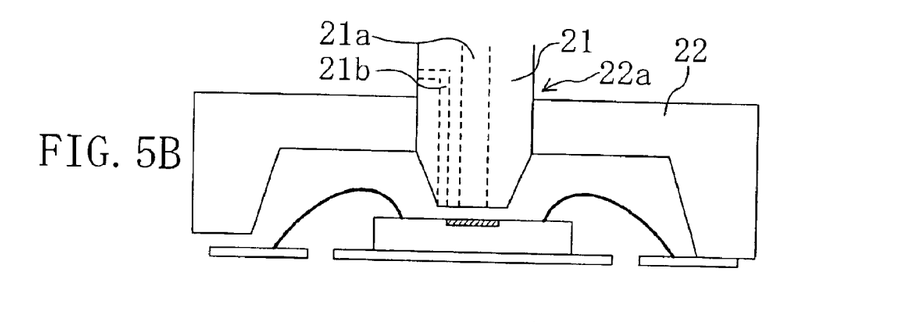

First, as shown in FIG. 5A, the integrated circuit device 1 having the photo detecting part 11 is prepared together with the leads 2 electrically connected with the integrated circuit device 1 via the wires 4. As shown in FIG. 5B, a pin 21 and a mold 22 having a hole 22a for insertion of the pin 21 are placed. In this placement, the pin 21 is positioned to stand above the photo detecting part 11 of the integrated circuit device 1 through the hole 22a of the mold 22 (step (1)). Inside the pin 21, a first through hole 21a for blowing of gas and a second through hole 21b for escape of the blown gas are formed. The tip of the pin 21 has a shape of a truncated cone. A slight gap is secured between the tip of the pin 21 and the photo detecting part 11 to prevent the tip of the pin 21 from coming into contact with the surface of the photo detecting part 11 and thus avoid damage to the photo detecting part 11.

Figure 5C:
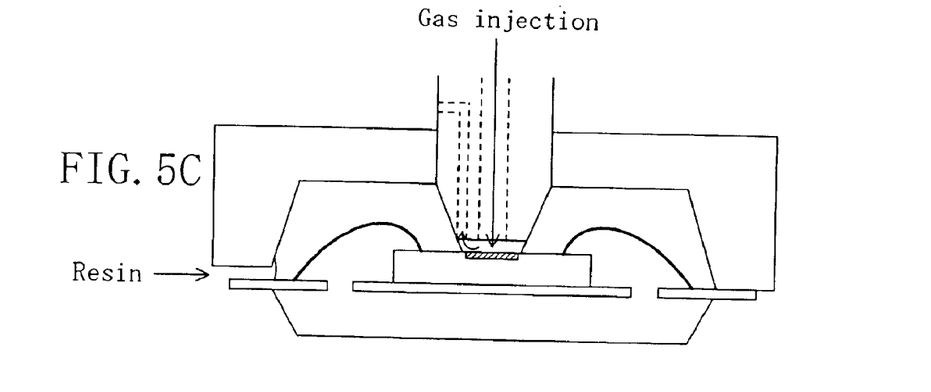

As shown in FIG. 5C, a thermosetting resin for formation of encapsulation is poured into the mold (step (2)), and concurrently with this pouring, a high-temperature inert gas is blown into the mold via the through hole 21a of the pin 21 (step (3)). As the temperature of the inert gas, any temperature high enough to allow setting of the poured thermosetting resin is acceptable. The poured thermosetting resin sets with the heat of the inert gas before it reaches the vicinity of the photo detecting part 11.

Figure 5D:
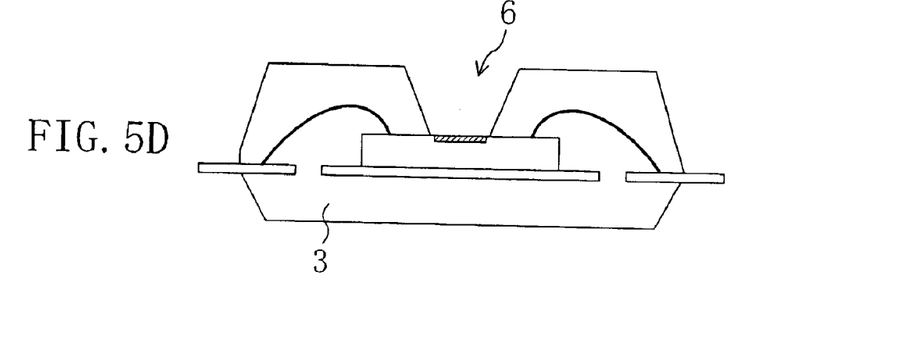

Thereafter, the pin 21 and the mold 22 are removed, to complete formation of the encapsulation section 3 having the hole 6 above the photo detecting part 11 as shown in FIG. 5D. The hole 6 has a truncated cone shape according to the truncated cone shape of the tip of the pin 21.

In the step (1), either the pin 21 or the mold 22 may be placed first. That is, the mold 22 may be placed first followed by positioning of the pin 21 in the hole 22a. Alternatively, the pin 21 may be placed first followed by placement of the mold 22. Otherwise, the pin 21 and the mold 22 may be combined together in advance, and then the combination may be positioned with respect to the integrated circuit device 1.

The pin 21 may be placed so that the tip thereof comes into contact with the surface of the integrated circuit device 1. This enables complete or roughly complete elimination of the resin from the light receiving surface. Alternatively, the pin 21 may be placed to be apart from the surface of the integrated circuit device 1 by a predetermine distance, to provide a recess 5 as described in Embodiment 1. By appropriately setting the predetermined distance, the thickness of the bottom portion underlying the recess 5 can be controlled. For example, by setting the distance to be shorter than the length corresponding to the height of the wires 4, it is possible to form the recess 5 having an underlying bottom portion thinner than the height of the wires 4.

In place of blowing of the high-temperature gas, a liquid allowing setting of the encapsulation material may be poured into the mold.

In place of the inert gas, a gas containing an inert gas as a main component may be used.

The shape of the tip of the pin 21 may not necessarily be a truncated cone, but may be a column, a prism, a truncated pyramid or the like. The hole 6 or the recess 5 having a shape corresponding to the shape of the tip of the pin 21 will be formed.

The step (3) may be executed before or after the step (2), not concurrently with the step (2). If at least the tip of the pin 21 is heated before the step (3) or concurrently with the step (3), the encapsulation section 3 can be formed more efficiently.

(Embodiment 4)

Figure 6A:
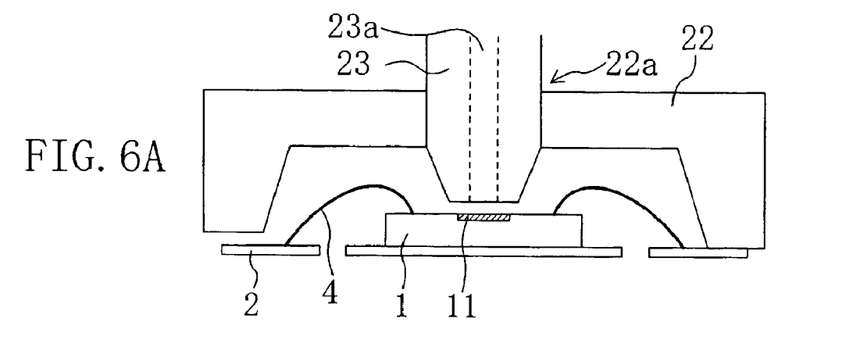
FIGS. 6A to 6C are cross-sectional views showing process steps of a packaging method for an integrated circuit device of Embodiment 4 of the present invention.
Figure 6B:
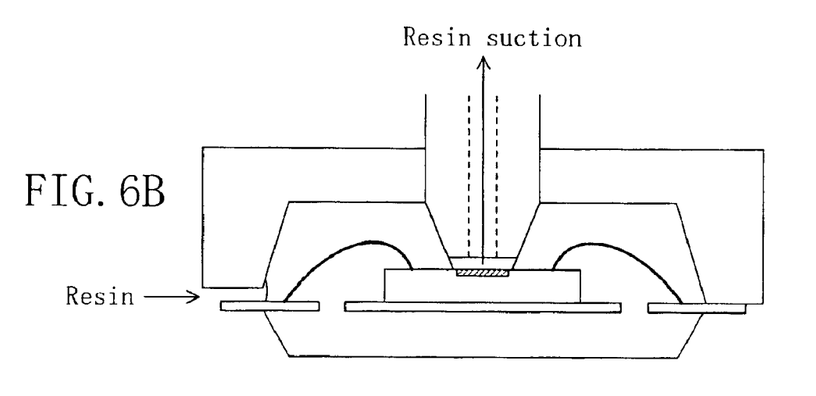
Figure 6C:
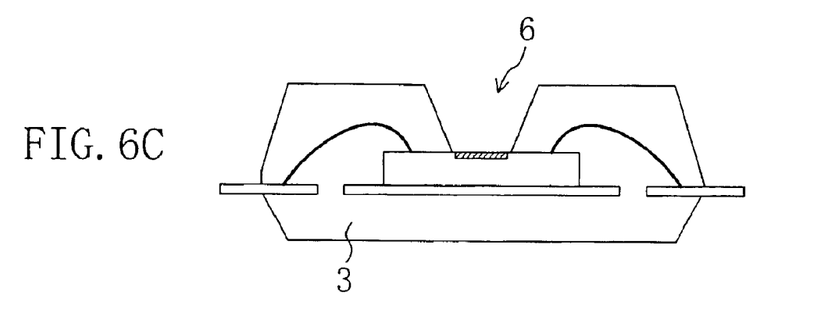

FIGS. 6A to 6C are cross-sectional views showing process steps of a packaging method for an integrated circuit device of Embodiment 4 of the present invention. In FIGS. 6A to 6C, the same components as those in FIG. 4 are denoted by the same reference numerals.

First, the integrated circuit device 1 having the photo detecting part 11 is prepared together with the leads 2 electrically connected with the integrated circuit device 1 via the wires 4. As shown in FIG. 6A, a pin 23 and the mold 22 having the hole 22a for insertion of the pin 23 are placed. In this placement, the pin 23 is positioned to stand above the photo detecting part 11 of the integrated circuit device 1 through the hole 22a of the mold 22 (step (1)). Inside the pin 23, a through hole 23a for sucking a resin for formation of encapsulation is formed. The tip of the pin 23 has a shape of a truncated cone. A slight gap is secured between the tip of the pin 23 and the photo detecting part 11 to prevent the tip of the pin 23 from coming into contact with the surface of the photo detecting part 11.

As shown in FIG. 6B, a thermosetting resin for formation of encapsulation is poured into the mold (step (2)), and the poured resin is sucked from the surface of the photo detecting part 11 via the through hole 23a of the pin 23 (step (3)). By this sucking, the poured thermosetting resin is removed from the surface of the photo detecting part 11. The suction of the resin may be done at the timing before, during or after the setting of the resin.

Thereafter, the pin 23 and the mold 22 are removed, to complete formation of the encapsulation section 3 having the hole 6 above the photo detecting part 11 as shown in FIG. 6C. The hole 6 has a truncated cone shape according to the truncated cone shape of the tip of the pin 23.

(Embodiment 5)

Figure 7A:
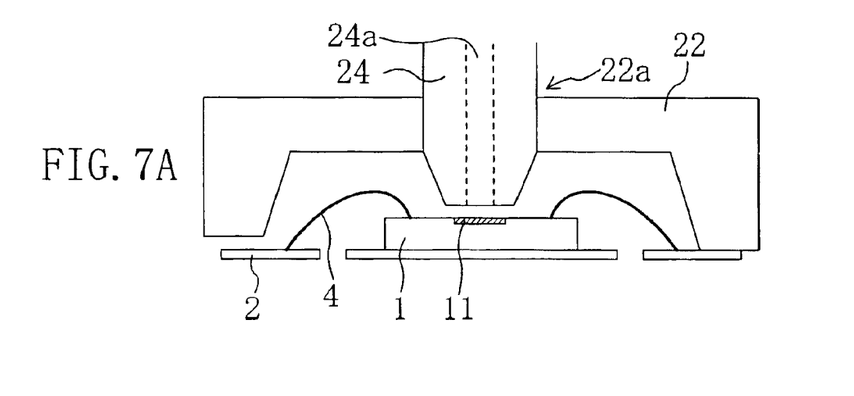
FIGS. 7A to 7C are cross-sectional views showing process steps of a packaging method for an integrated circuit device of Embodiment 5 of the present invention.
Figure 7B:
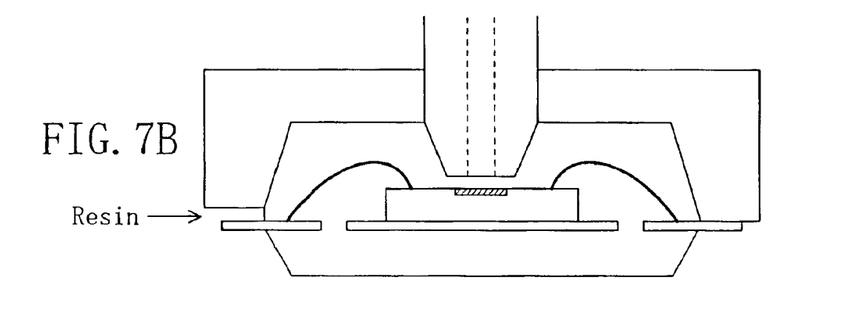
Figure 7C:
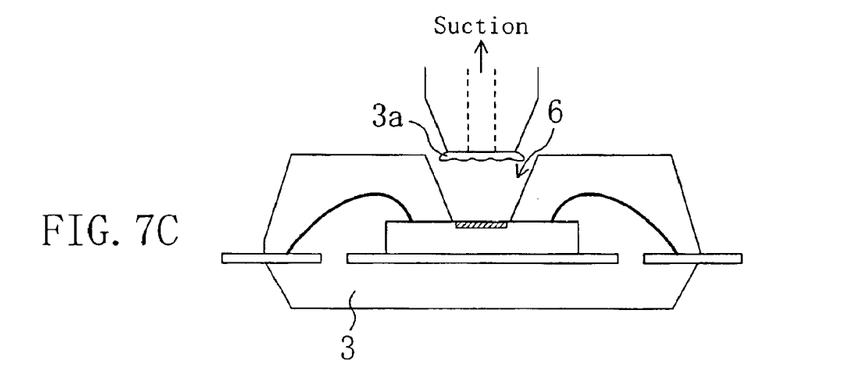

FIGS. 7A to 7C are cross-sectional views showing process steps of a packaging method for an integrated circuit device of Embodiment 5 of the present invention. In FIGS. 7A to 7C, the same components as those in FIG. 4 are denoted by the same reference numerals.

First, the integrated circuit device 1 having the photo detecting part 11 is prepared together with the leads 2 electrically connected with the integrated circuit device 1 via the wires 4. As shown in FIG. 7A, a pin 24 and the mold 22 having the hole 22a for insertion of the pin 24 are placed. In this placement, the pin 24 is positioned to stand above the photo detecting part 11 of the integrated circuit device 1 through the hole 22a of the mold 22 (step (1)). Inside the pin 24, formed is a through hole 24a for adsorbing and removing a resin for formation of encapsulation existing on the surface of the photo detecting part 11. The tip of the pin 24 has a shape of a truncated cone. A slight gap is secured between the tip of the pin 24 and the photo detecting part 11 to prevent the tip of the pin 24 from coming into contact with the surface of the photo detecting part 11.

As shown in FIG. 7B, a thermosetting resin for formation of encapsulation is poured into the mold (step (2)). During the pouring, at least the tip of the pin 24 is preferably heated. Alternatively, it may be preheated before the pouring of the resin. As shown in FIG. 7C, a resin portion 3a that has set on the surface of the photo detecting part 11 is adsorbed to the pin 24 under suction via the through hole 24a, and removed together with the pin 24 (step (3)). Thereafter, the pin 24 and the mold 22 are removed, to complete formation on the encapsulation section 3 having the hole 6 above the photo detecting part 11. The hole 6 has a truncated cone shape according to the truncated cone shape of the tip of the pin 24.

In the step (2), a high-temperature gas may be blown via the through hole 24a of the pin 24, to facilitate setting of the resin.

A gas may be passed through the through hole 24a of the pin 24 before the step (2) for cleaning the inside of the through hole 24a. This passing of a gas through the through hole 24a may be performed after the step (3).

(Embodiment 6)

Figure 8A:
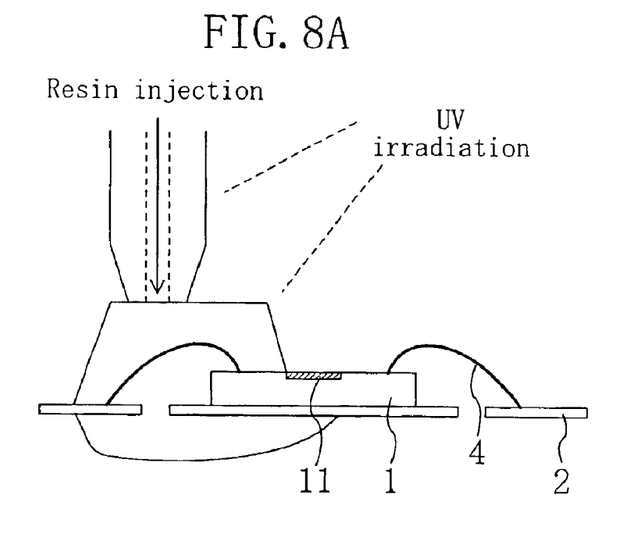
FIGS. 8A and 8B are cross-sectional views each showing a process step of a packaging method for an integrated circuit device of Embodiment 6 of the present invention.
Figure 8B:
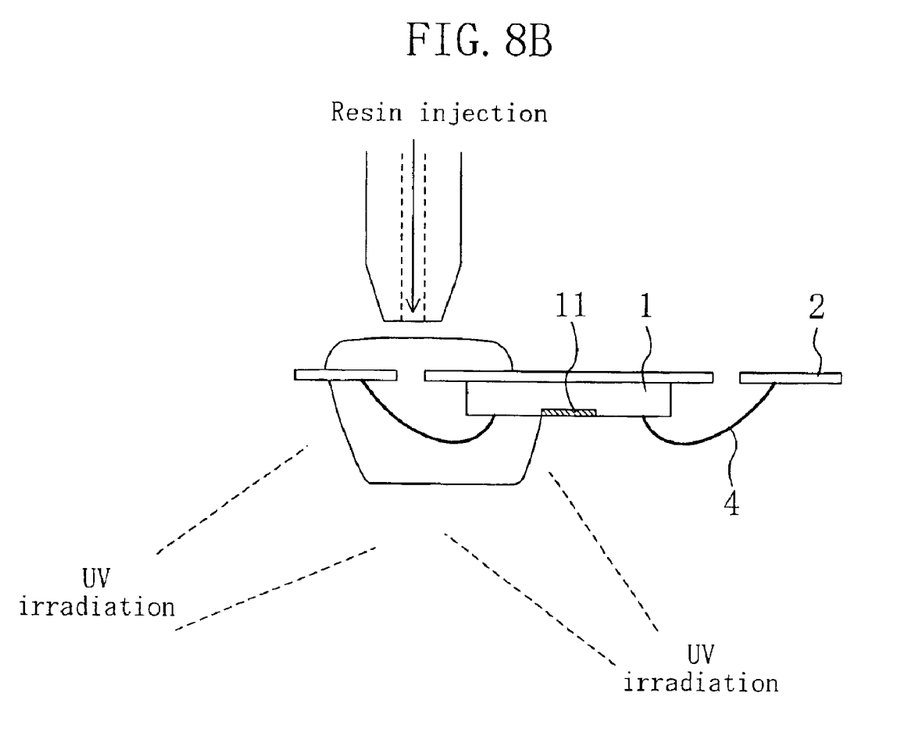

FIGS. 8A and 8B are views showing packaging methods for an integrated circuit device of Embodiment 6 of the present invention. In this embodiment, an UV-curable resin is applied under UV irradiation, to form an encapsulation section having a hole 6 above the photo detecting part 11.

In the case shown in FIG. 8A, an UV-curable resin is applied over the integrated circuit device 1 having the photo detecting part 11, the leads 2 and the wires 4, except for the surface of the photo detecting part 11. While being applied, the resin is irradiated with UV to be solidified instantaneously. This is like coating the integrated circuit device 1 and the like with the resin over and over again. By this application, only the portions including the wires 4, except for the surface of the photo detecting part 11, can be encapsulated, and in this way, the encapsulation section having the hole 6 can be formed.

In the case shown in FIG. 8B, the UV-curable resin is applied from the side of the back surface of the integrated circuit device 1, that is, the surface opposite to the surface having the photo detecting part 11, while UV irradiation is performed from the side of the main surface of the integrated circuit device 1, that is, the surface having the photo detecting part 11 to solidify the resin instantaneously. During this process, care is taken to keep the surface of the photo detecting part 11 from being encapsulated. Only the surroundings of the wires 4 can be encapsulated by surface tension. In this way, only the necessary portions can be encapsulated, and thus the resultant package can be thinner and lighter.

Figure 12A:
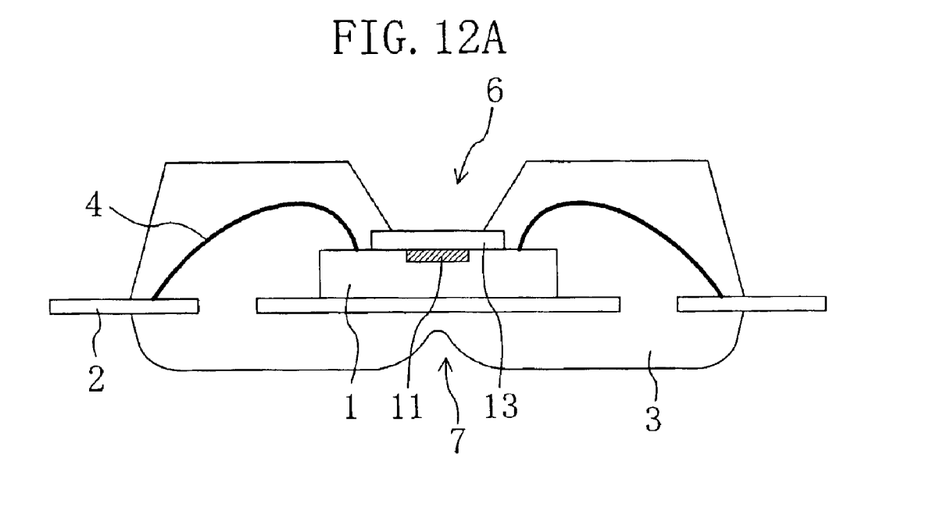
FIGS. 12A and 12B are cross-sectional views of packaging structures of an integrated circuit device of Embodiment 6 of the present invention.
Figure 12B:
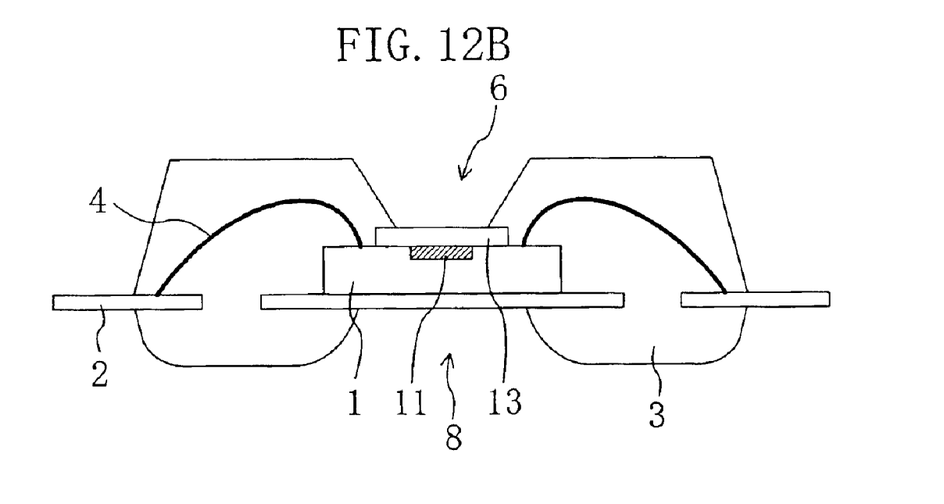

By packaging the integrated circuit device 1 by the methods of this embodiment described above, packaging structures as shown in FIGS. 12A and 12B are obtained. In FIG. 12A, the encapsulation section 3 has a recess 7 formed at a position opposite to the photo detecting part 11 with respect to the integrated circuit device 1. In FIG. 12B, the encapsulation section 3 has a second hole 8 formed at a position opposite to the photo detecting part 11 with respect to the integrated circuit device 1. A recess 5 as shown in FIG. 2 may be formed in place of the hole 6 by putting the resin in the hole 6, for example. In this case, in FIG. 12A, the encapsulation section 3 has a second recess 7 formed at a position opposite to the photo detecting part 11 with respect to the integrated circuit device 1. In FIG. 12B, the encapsulation section 3 has a hole 8 formed at a position opposite to the photo detecting part 11 with respect to the integrated circuit device 1.

(Embodiment 7)

Figure 9A:
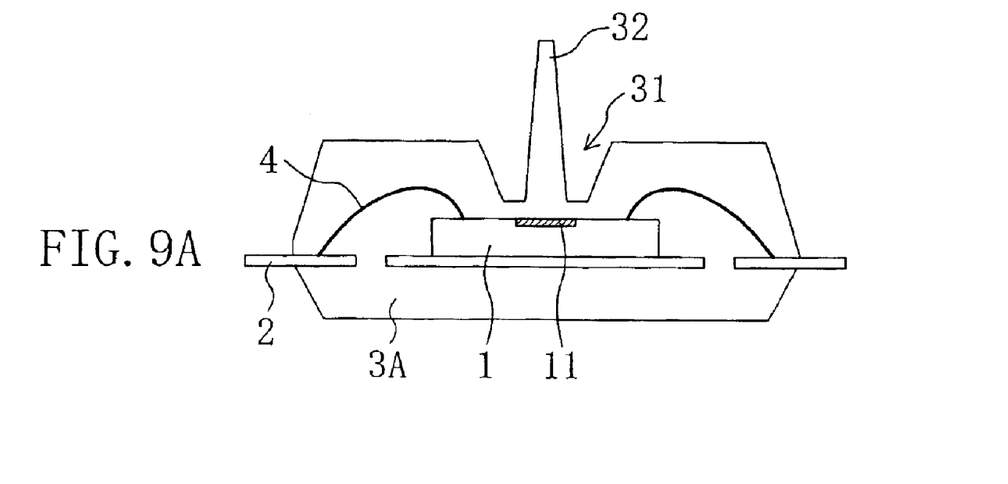
FIGS. 9A to 9C are views showing a packaging method for an integrated circuit device of Embodiment 7 of the present invention.
Figure 9B:
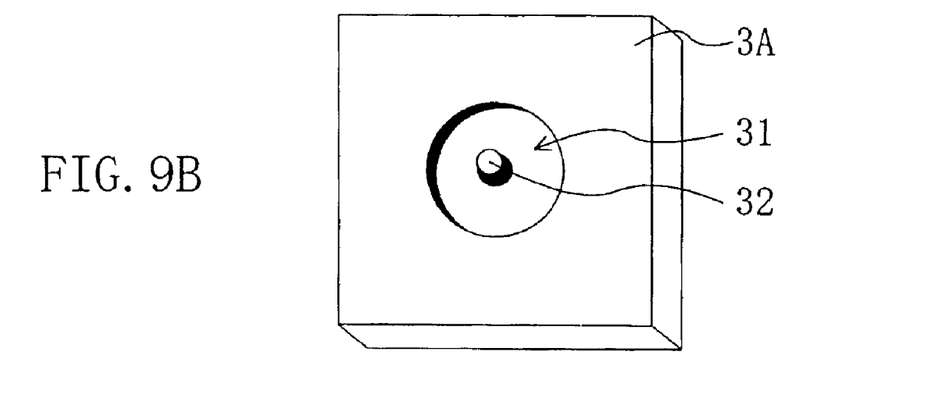
Figure 9C:
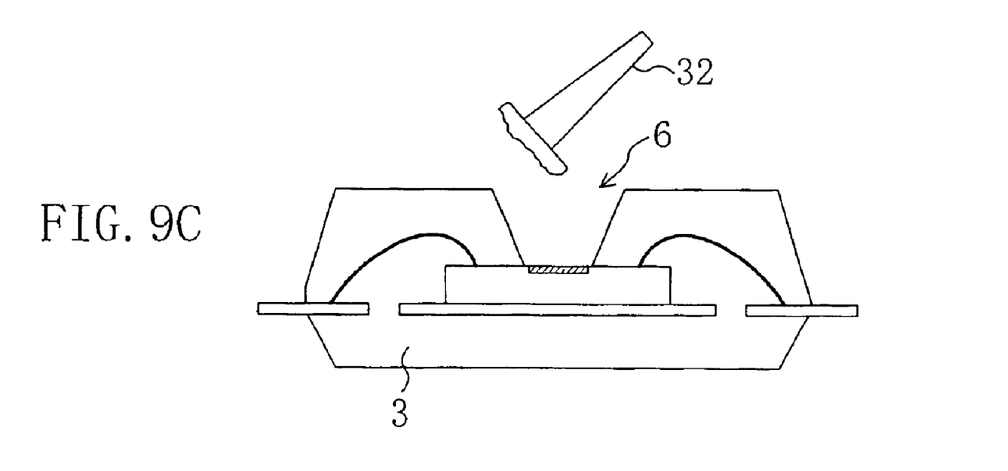

FIGS. 9A to 9C are views showing a packaging method for an integrated circuit device of Embodiment 7 of the present invention. In this embodiment, as shown in FIG. 9A, an encapsulation section 3A is first formed, which has a recess 31 on the light incident surface above the photo detecting part and a projection 32 projecting from the bottom of the recess 31. FIG. 9B is a plan view of the encapsulation section 3A, in which the bottom of the recess 31 has an outline of a circle. The encapsulation section 3A of this shape can be formed using a mold or using a pin, for example, as will be described later.

As shown in FIG. 9C, the projection 32 is snapped off to thereby remove the bottom portion underlying the recess 31. This results in exposure of the surface of the photo detecting part 11 from the encapsulation section 3, forming the hole 6.

The outline of the bottom of the recess 31 may not necessarily be a circle, but may be an ellipse, a rectangle or a polygon. From the standpoint of easiness of snapping, a circle or an ellipse is preferred.

The projection 32 is preferably made higher than the level of the portion encapsulating the wires 4 for easiness of snapping of the projection 32.

Figure 10A:
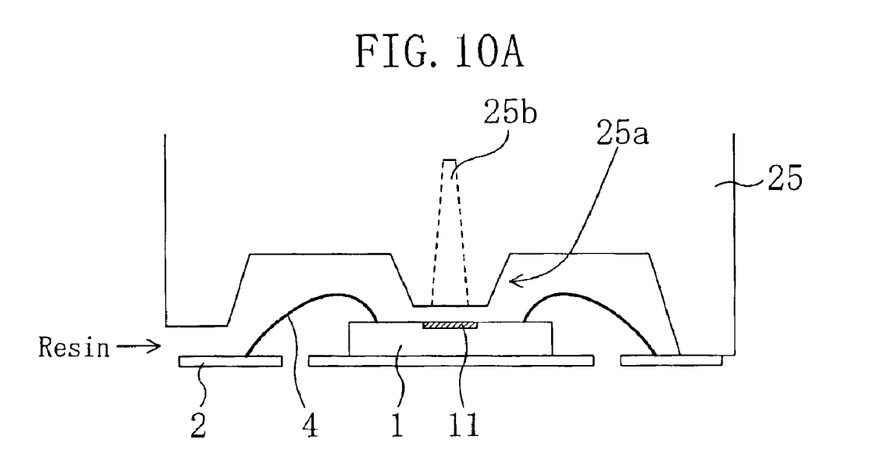
FIGS. 10A and 10B are views showing the packaging method for an integrated circuit device of Embodiment 7 of the present invention.

FIGS. 10A and 10B are cross-sectional views each illustrating a process of forming the encapsulation section 3A shown in FIG. 9A. In the case shown in FIG. 10A, a mold 25, which has a protrusion 25a and a hole 25b formed from the top face of the protrusion 25a, is placed so that the protrusion 25a is located above the photo detecting part 11. Thereafter, a material for encapsulation, such as a thermosetting resin, for example, is poured into the mold 25, to form the encapsulation section 3A. During the pouring, to ensure formation of the projection 32, the resin may be pressed into the hole 25b, or a through hole communicating with the hole 25b may be formed to allow sucking of the resin into the hole 25b using the through hole.

Figure 10B:
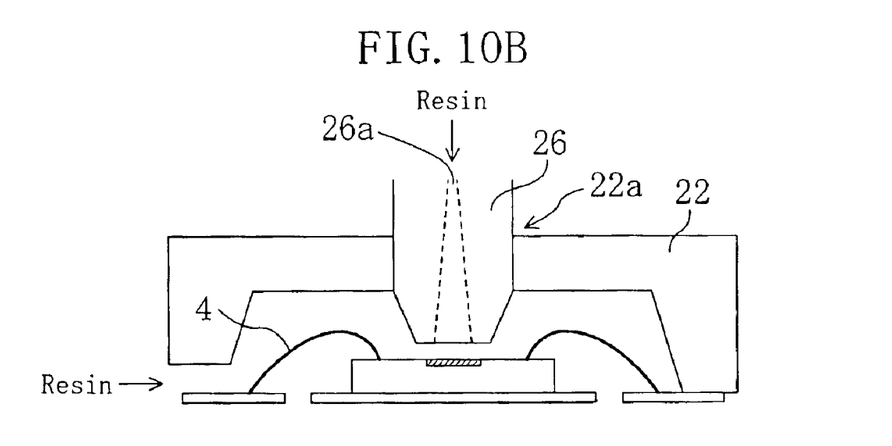

In the case shown in FIG. 10B, a pin 26 having a through hole 26a formed inside and a mold 22 having a hole 22a for insertion of the pin 26 are placed so that the pin 26 is positioned to stand above the photo detecting part 11 through the hole 22a of the mold 22. Thereafter, a material for encapsulation, such as a thermosetting resin, for example, is poured into the mold 25. The resin is also poured into the through hole 26a of the pin 26. In this way, the encapsulation section 3A is formed.

In the embodiments described above, wires were used for electrical connection between the integrated circuit device and the leads. It should be noted that the present invention is also applicable to structures in which the electrical connection is realized by means other than using wires, such as bonding, crimping, welding and using bumps.

As described above, according to the present invention, a practically suitable packaging structure can be provided for an integrated circuit device receiving short-wavelength laser light.

What is claimed is:

1. A packaging structure of an integrated circuit device having a photo detecting part, comprising:
   a lead electrically connected with the integrated circuit device; and
   an encapsulation section for encapsulating the integrated circuit device and the lead, wherein the encapsulation section has a recess formed on a light incident surface above the photo detecting part,
   wherein the recess has an outline allowing discernment of the position of a predetermined pin of the integrated circuit device when viewed from top.

2. The structure of claim 1, wherein the outline of an open top end of the recess is a rectangle, and one corner of the rectangle is different in shape from the other corners.

3. The structure of claim 2, wherein the one corner protrudes toward the center of the rectangle.

4. A packaging structure of an integrated circuit device having a photo detecting part, comprising:
   a lead electrically connected with the integrated circuit device; and
   an encapsulation section for encapsulating the integrated circuit device and the lead,
   wherein the encapsulation section has a hole formed above the photo detecting part, and
   wherein the hole has an outline allowing discernment of the position of a predetermined pin of the integrated circuit device when viewed from top.

5. The structure of claim 4, wherein the outline of an open top end of the hole is a rectangle, and one corner of the rectangle is different in shape from the other corners.

6. The structure of claim 5, wherein the one corner protrudes toward the center of the rectangle.

* * * * *

UNITED STATES PATENT AND TRADEMARK OFFICE
CERTIFICATE OF CORRECTION

PATENT NO. : 6,924,540 B2
DATED : August 2, 2005
INVENTOR(S) : Yasufumi Shirakawa et al.

It is certified that error appears in the above-identified patent and that said Letters Patent is hereby corrected as shown below:

Title page,
Item [54], Title, change "INTEGRATED CIRCUIT DEVICE INSTALLED STRUCTURE AND INSTALLATION METHOD" to -- PACKAGING STRUCTURE OF AN INTEGRATED CIRCUIT DEVICE HAVING A PHOTO DETECTING PART --.

Signed and Sealed this

Fourteenth Day of March, 2006

JON W. DUDAS
*Director of the United States Patent and Trademark Office*